(12) United States Patent
Lin et al.

(10) Patent No.: US 8,854,450 B2
(45) Date of Patent: Oct. 7, 2014

(54) ALIGNMENT METHOD FOR ASSEMBLING SUBSTRATES IN DIFFERENT SPACES WITHOUT FIDUCIAL MARK AND ITS SYSTEM

(75) Inventors: Chorng-tyan Lin, Kaohsiung (TW);
Chih-chin Wen, Kaohsiung (TW);
Chun-ming Yang, Kaohsiung (TW);
Jwu-jiun Yang, Kaohsiung (TW)

(73) Assignee: Metal Industries Research & Development Centre, Kaohsiung (TW)

( * ) Notice: Subject to any disclaimer, the term of this patent is extended or adjusted under 35 U.S.C. 154(b) by 401 days.

(21) Appl. No.: 13/352,302

(22) Filed: Jan. 17, 2012

(65) Prior Publication Data
US 2013/0147942 A1 Jun. 13, 2013

(30) Foreign Application Priority Data
Dec. 8, 2011 (TW) .............................. 100145344 A (51) Int. Cl.
*H04N 7/18* (2006.01)

(52) U.S. Cl.
USPC ............................................ 348/87; 382/151

(58) Field of Classification Search
CPC ..... H04N 7/18; H05K 13/08; H05K 13/0413; G01R 31/309
USPC ............................................ 348/87; 382/151
See application file for complete search history.

(56) References Cited

U.S. PATENT DOCUMENTS

| | | | | |
|---|---|---|---|---|
| 5,903,662 A * | 5/1999 | DeCarlo | .................. | 382/151 |
| 6,993,177 B1 * | 1/2006 | Bachelder | .................. | 382/151 |
| 7,734,084 B2 * | 6/2010 | Stewart et al. | .................. | 382/151 |
| 7,817,846 B2 * | 10/2010 | Chung et al. | .................. | 382/151 |
| 2006/0078192 A1 * | 4/2006 | Oh et al. | .................. | 382/151 |

FOREIGN PATENT DOCUMENTS

TW   I288365   10/2007

* cited by examiner

*Primary Examiner* — Jayanti K Patel
*Assistant Examiner* — Francis G Geroleo
(74) *Attorney, Agent, or Firm* — Cheng-Ju Chiang (57) ABSTRACT

An alignment method for assembling substrates in different spaces without fiducial mark and its system are provided, and the alignment method has steps of: pre-defining partially standard character regions of two substrates; capturing at least two partially actual images of two substrates in different waiting spaces, respectively; comparing to obtain at least two partially actual character regions of the two substrates, respectively; building actual coordinate systems of the two substrates, respectively; comparing the actual coordinate systems of the two substrates with each other to obtain a set of offset values; moving the two substrates from the different waiting spaces to an alignment-and-installation space based on the set of offset values and a predetermined movement value, respectively; and stacking the two substrates with each other to finish the alignment and installation in the alignment-and-installation space.

7 Claims, 8 Drawing Sheets

ALIGNMENT METHOD FOR ASSEMBLING SUBSTRATES IN DIFFERENT SPACES WITHOUT FIDUCIAL MARK AND ITS SYSTEM

BACKGROUND OF THE INVENTION

1. Field of Invention

The present invention relates to an alignment method for assembling substrates in different spaces without fiducial mark and its system and more particularly to an alignment method for assembling substrates in different spaces and its system which directly employ characters of surface shapes of substrates as referenced fiducial marks to calculate movement compensation values of two substrates without fiducial mark in different space systems, respectively.

2. Related Art

In the technological fields of liquid crystal display, semiconductor chip and printed circuit board (PCB), precise stacking and alignment for the assembling of a plurality of substrates are demanded, so that various alignment apparatuses and special fiducial marks are developed by manufacturers in order to align and assemble substrates more precisely and speedily.

Figure 1:
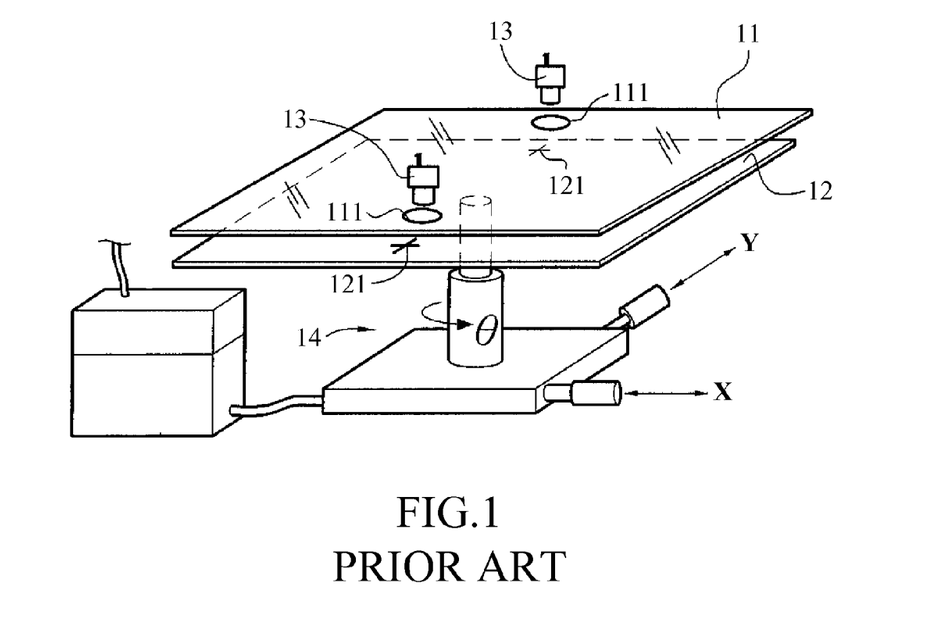
FIG. 1 is an illustration of existing dual plates and alignment fiducial marks thereof.

Refer to FIG. 1 for an example, the Taiwanese Patent No. 1288365 applied by the applicant of the present invention discloses an alignment fiducial marks design for an alignment and movement control system of dual plates and its image processing method, an existing alignment and movement control method of dual plates is provided for precise alignment of a first plate and a second plate, it mainly includes following steps of:

In a step (S1): providing two sets of alignment fiducial marks 111 and 121 disposed at same positions on two opposite sides on a first plate 11 and a second plate 12, respectively;

In a step (S2): obtaining two sets of composite images of the alignment fiducial marks 111 and 121 by two image capturing devices 13 disposed at two opposite sides of the first plate 11 or the second plate 12;

In a step (S3): calculating offset values of two sets of coordinates of the composite images by an image processing method to obtain the offset values ($\Delta X1$, $\Delta Y1$), ($\Delta X2$, $\Delta Y2$) of the two coordinate sets;

In a step (S4): obtaining offset values $\Delta X1$, $\Delta Y1$ of positions and an offset value AO of angle between the first plate 11 and the second plate 12 by calculating the offset values of the two coordinate sets; and In a step (S5): compensating the offset values of positions and the offset value of angle by a tri-axial movement control module 14.

The alignment and movement control method of dual plates employs the circular alignment holes as well as cross, circular or rectangular alignment fiducial marks as the alignment fiducial marks 111 and 121 between the first plate 11 and the second plate 12. Even though the precise alignment of the dual plates can be done automatically and speedily, the alignment process may not be able to be finished smoothly because of the overlapping of images; and the alignment holes and alignment fiducial marks have to be pre-designed on the two substrates separately, which will increase the work procedures and costs. Furthermore, when a space for assembling the first plate 11 and the second plate 12 is limited, the action of moving the second plate 12 by the tri-axial movement control module 14 may be affected by disposing the two image capturing devices 13 in the same limited assembling space, and therefore the alignment and movement control method of dual plates can not be easily embodied in a limited assembling space.

Therefore, an improved alignment method for assembling substrates is required to solve the existing problems of the conventional techniques.

SUMMARY OF THE INVENTION

A primary object of the present invention is to provide an alignment method for assembling substrates in different spaces without fiducial mark and its system, when two substrates are disposed in two waiting spaces of different space systems, existing characters of surface shapes of partially specific regions of the two substrates in the different waiting spaces are captured by two sets of image capturing units, respectively, for being directly used as referenced fiducial marks to replace the existing alignment holes and fiducial marks, and to be provided for subsequent procedures of coordinates calculating, positions calibrating and alignment for assembling, so that the movement compensation values required for the assembling of the to-be-installed substrates can be calculated without any fiducial mark specifically designed for alignment, and the limited space for alignment and assembling will not be occupied, thus the costs of alignment for assembling can be reduced, the alignment precision and a flexibility of the set up of alignment equipment can be enhanced.

A secondary object of the present invention is to provide an alignment method for assembling substrates in different spaces without fiducial mark and its system, existing characters of surface shapes of partially specific regions of two substrates are directly used as referenced fiducial marks, specific regions on the two substrates are not required to be reserved, respectively, for disposing alignment holes and fiducial marks, so that the spaces on surfaces of the two substrates will not be occupied and the dimensions of the two substrates will not be affected, also the appearances of the two substrates will not be affected and the designing for the two substrates can be simplified.

Another object of the present invention is to provide an alignment method for assembling substrates in different spaces without fiducial mark and its system, when alignment and assembling are processed for substrates of different specifications by machines, existing characters of a surface shape of a particular partial region of the two substrates can be set and changed as referenced fiducial marks by an image processing device based on the different specifications of the substrate, so that a flexibility of operational settings for the alignment and assembling of the substrates can be enhanced.

To achieve the above object, the present invention provides an alignment method for assembling substrates in different spaces without fiducial mark, which comprises steps of:

a step (S01) of pre-capturing at least two partially standard images of a first substrate and a second substrate, respectively, and pre-defining a partially standard character region in each of the partially standard images of the first and second substrates and storing character data of shapes of the partially standard character regions before assembling;

a step (S02) of disposing another to-be-aligned first substrate and another to-be-aligned second substrate in two different waiting spaces, respectively, and capturing at least two partially actual images of the first and second substrates when assembling;

a step (S03) of comparing the partially actual images of the first and second substrates with the character data of shapes of the corresponding partially standard character regions to obtain at least two partially actual character regions in each of the partially actual images matching with the corresponding partially standard character regions;

a step (S04) of building actual coordinate systems of the first and second substrates by using center coordinates of the partially actual character regions;

a step (S05) of comparing the actual coordinate systems of the first and second substrates to obtain a set of offset values ΔX, ΔY, Δθ of the first substrate on the X and Y axial directions and the rotational angle required to be moved from its waiting space to an alignment-and-installation space; and a step (S06) of moving the first substrate to a correct waiting position in the alignment-and-installation space based on the set of offset values, and moving the second substrate to the other correct waiting position in the alignment-and-installation space based on a predetermined movement value.

In one embodiment of the present invention, after the step (S06), further comprising:

a step (S07) of capturing the partially actual images of the first and second substrates in the alignment-and-installation space and calculating the coordinate values of the partially actual images, in order to ensure if the first and second substrates are disposed at the correct waiting positions in the alignment-and-installation space, respectively, if yes, then proceeding to a step (S08); if not, then processing the step (S07) again after the positions of the first and second substrates are fine tuned; and a step (S08) of moving the first substrate along the Z axis in the alignment-and-installation space until the first substrate is aligned with the second substrate in the alignment-and-installation space to finish alignment and assembling.

In one embodiment of the present invention, after the step (S06), directly proceeding to:

a step (S08) of moving the first substrate along the Z axis in the alignment-and-installation space until the first substrate is aligned with the second substrate in the alignment-and-installation space to finish alignment and assembling.

In one embodiment of the present invention, the center coordinates of a central position of each of the partially actual character regions of the first and second substrates in the step (S04) are obtained by computing with a centroid method in order to build the actual coordinate systems of the first and second substrates, respectively.

In one embodiment of the present invention, a tri-axial movement device is used to move the first substrate along the X, Y and θ axes in the step (S06).

In one embodiment of the present invention, the tri-axial movement device is used to further move the first substrate along the Z axis vertically.

In one embodiment of the present invention, at least one supporting platform and a rotational platform are further included in the step (S06), the supporting platform is used to support the second substrate, and the rotational platform is used to rotate and move the second substrate horizontally along the X and Y planes to the alignment-and-installation space.

In one embodiment of the present invention, the first and the second substrates are selected from two single layered circuit substrates of a multi-layered printed circuit board, two glass substrates of a liquid crystal panel module, an outer frame of a display and a liquid crystal panel module, a glass photomask and a wafer, or a chemical test paper and a protective film. The types or positions of the first and the second substrates also can be interchanged.

On the other hand, to achieve the above object, the present invention further provides an alignment system for assembling substrates in different spaces without fiducial mark, which comprises:

at least one first image capturing unit to capture at least two partially standard images of a first substrate before assembling, and/or to capture at least two partially actual images of another to-be-aligned first substrate placed in a first waiting space when the assembling is being processed;

at least one second image capturing unit to capture at least two partially standard images of a second substrate before assembling; and/or to capture at least two partially actual images of another to-be-aligned second substrate placed in a second waiting space when the assembling is being processed;

an image processing device, selectively to:
(1) pre-define a partially standard character region in the partially standard images of the first and second substrates, respectively, and store the character data of shapes of the partially standard character regions;
(2) compare the partially actual images of the first and second substrates with the character data of shapes of the corresponding partially standard character regions, in order to obtain at least two partially actual character regions in each of the partially actual images matching with the corresponding partially standard character regions;
(3) build an actual coordinate system of each of the first and second substrates by using the center coordinates of the partially actual character regions, respectively; or
(4) compare the actual coordinate systems of the first and second substrates to obtain a set of offset values of the first substrate on the X and Y axial directions and a rotational angle required to be moved from the first waiting space to an alignment-and-installation space;

a tri-axial movement device to move the first substrate from the first waiting space to a correct waiting position in the alignment-and-installation space based on the set of offset values; and a carrying device having at least one set of supporting platform disposed thereon, wherein the carrying device is used to move the second substrate from the second waiting space to the other correct waiting position in the alignment-and-installation space based on a predetermined movement value.

In one embodiment of the present invention, the tri-axial movement device is used to further move the first substrate along the Z axis vertically.

DETAILED DESCRIPTION OF THE INVENTION

The above objects, characteristics, advantages and technical means adopted by the present invention to achieve the above and other objects can be best understood by referring to the following detailed description of the preferred embodiments and the accompanying drawings. Moreover, the following terms mentioned in the present invention, for instances, upper, lower, front, rear, left, right, inside, outside, lateral side, etc, are for directions in connection with the figures attached. Therefore, these direction terms are used to explain and help to comprehend the present invention, but not as limitations thereof.

The present invention provides an alignment method for assembling substrates in different spaces without fiducial mark and its system, when two substrates are disposed in two waiting spaces of different space systems, by employing existing characters of surface shapes of partially specific regions of the two substrates as referenced fiducial marks to be provided for subsequent procedures of coordinates calculating, positions calibrating and alignment for assembling, in order to replace the existing alignment holes and cross, circular or rectangular alignment fiducial marks, fiducial marks are thus not required to be specifically designed for the alignment of the two to-be-installed substrates, so that the present invention is limited to be applied to substrates without fiducial marks. If fiducial marks are included on the to-be-installed substrates specifically designed for alignment and assembling of dual or multi-plates, then they are not included in the application range of the method of the present invention.

Figure 2:
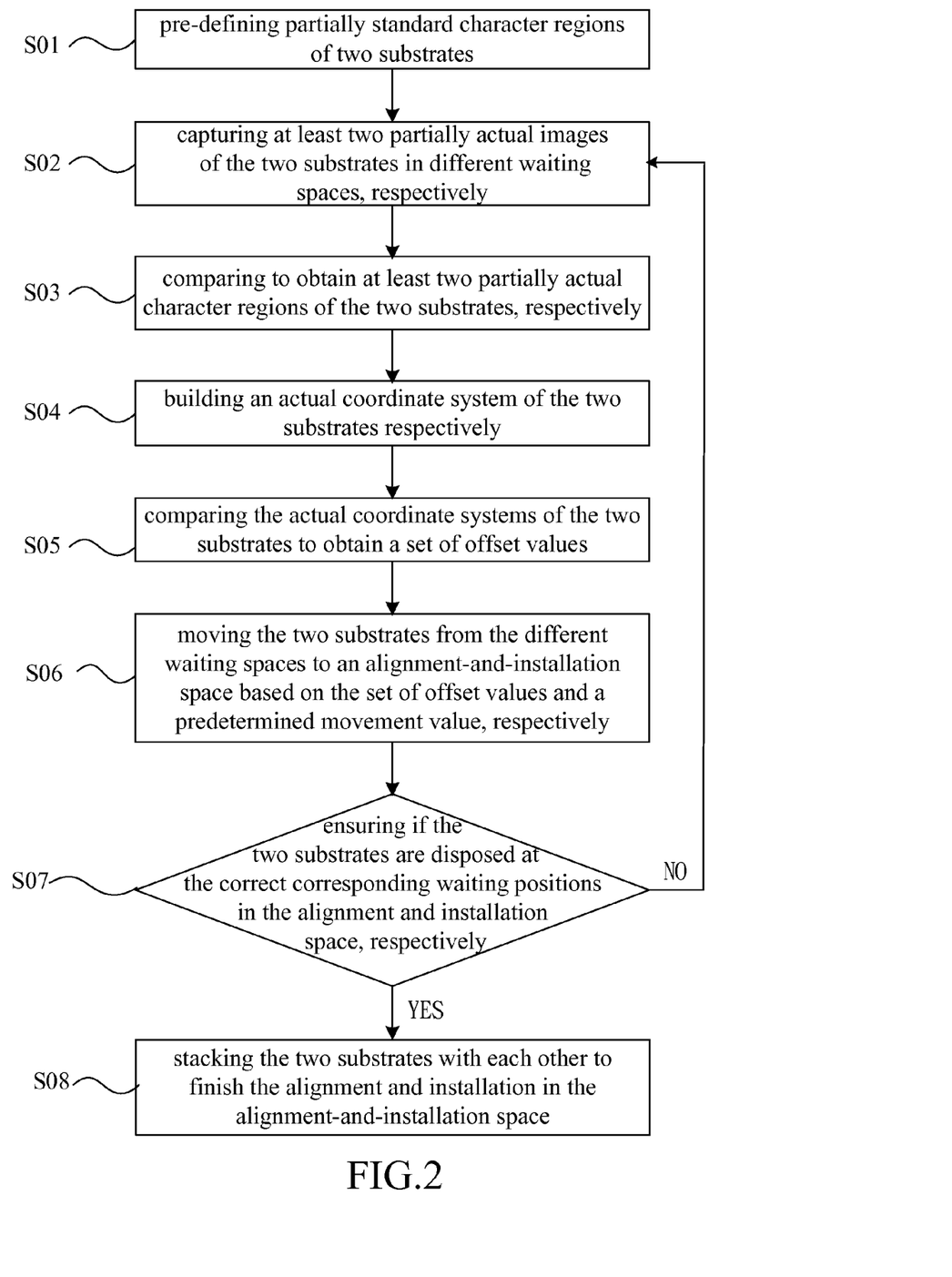
FIG. 2 is a block diagram of a flow chart of an alignment method for assembling substrates in different spaces without fiducial mark and its system according to a preferred embodiment of the present invention.

Referring to FIG. 2, the alignment method for assembling substrates in different spaces without fiducial mark of a preferred embodiment of the present invention mainly includes following steps of: (S01): pre-defining partially standard character regions of two substrates; (S02): capturing at least two partially actual images of the two substrates in different waiting spaces, respectively; (S03): comparing to obtain at least two partially actual character regions of the two substrates, respectively; (S04): building an actual coordinate system of the two substrates, respectively; (S05): comparing the actual coordinate systems of the two substrates to obtain a set of offset values; (S06): moving the two substrates from the different waiting spaces to an alignment-and-installation space based on the set of offset values and a predetermined movement value, respectively; (S07): ensuring if the two substrates are disposed at the correct corresponding waiting positions in the alignment-and-installation space, respectively; and (S08): stacking the two substrates with each other to finish the alignment and installation in the alignment-and-installation space. Embodied details and principles of the abovementioned steps of the preferred embodiment of the present invention will be described below using FIGS. 2 to 7.

Referring to FIGS. 2, 3, 3A and 3B, details of the step (S01) of the alignment method for assembling substrates in different spaces without fiducial mark of the preferred embodiment of the present invention are: pre-defining the partially standard character regions of two substrates. In the step, a first substrate 20 is first fixed in a first waiting space 100 (not but limited to be fixed in the first waiting space 100) by using a set of tri-axial movement device 40 by methods of vacuum sucking disc or clamping claws. Furthermore, in this embodiment, at least one set of supporting platform 60 and a carrying apparatus are set up beforehand, the supporting platform 60 is used for supporting a second substrate 30 and fixing the second substrate 30 on the carrying apparatus in a second waiting space 200 (not but limited to be fixed on the carrying apparatus); for this embodiment, the carrying apparatus is a rotational platform 70 for rotating and moving the supporting platform 60 and the second substrate 30 horizontally along the X and Y planes to an alignment-and-installation space 300; in other applications, the carrying apparatus can be a sliding platform for moving the supporting platform 60 and the second substrate 30 linearly along the X and Y planes to the alignment-and-installation space 300.

Figure 3:
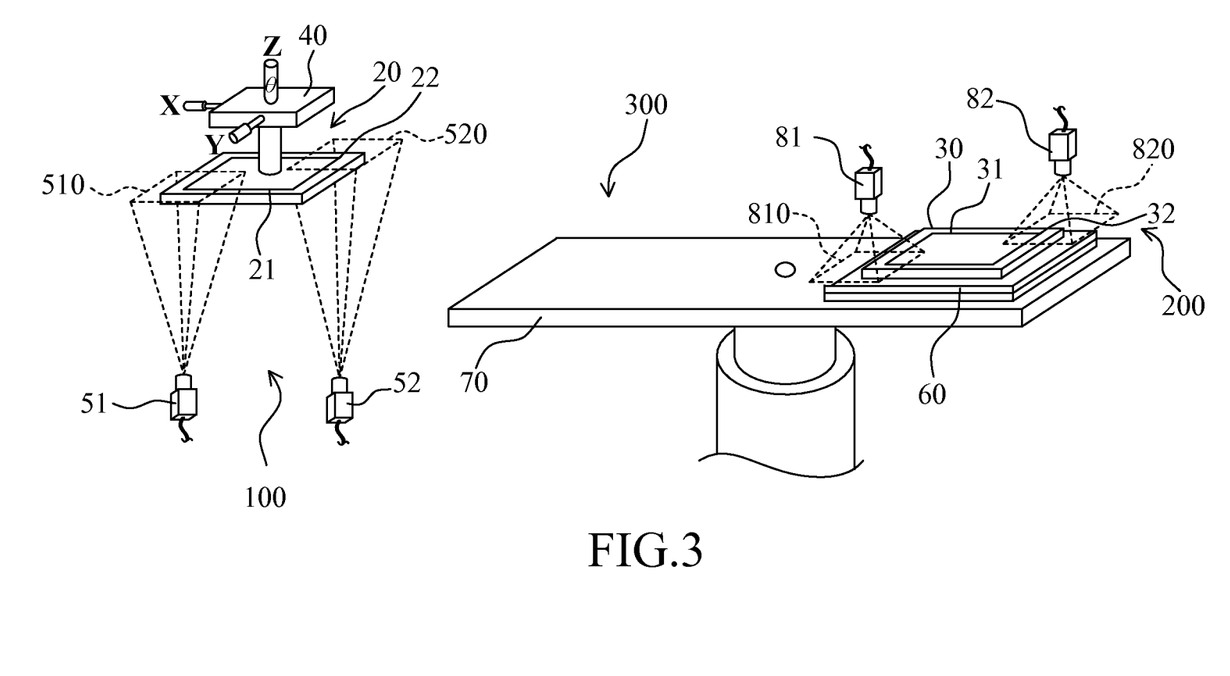
FIGS. 3, 3A and 3B are a perspective view and partially enlarged views of pre-defining partially standard character regions of two substrates in a step (S01) according to the preferred embodiment of the present invention.

In this embodiment, the first substrate 20 can be selected from: a single layered circuit substrate of a multi-layered printed circuit board, a glass substrate of a liquid crystal panel module, an outer frame of a display or a liquid crystal panel module, a glass photomask or a wafer, a chemical test paper or a protective film, but it is not limited to them. An outer frame of a display is used as the first substrate 20, it comprises an outer metal frame and a glass protective cover, the outer metal frame includes an inner edge 21 which has a plurality of inner edge corners 22. Furthermore, the second substrate 30 can be selected from the other corresponding components to be assembled with the first substrate 20. A liquid crystal panel module is used as the second substrate 60, and it has a sealant 31 for sealing an upper glass substrate and a lower glass substrate, the sealant 31 has a plurality of sealant corners 32. The second substrate 60 and the first substrate 20 (an outer frame of a display) are assembled together to form a semi-finished product of liquid crystal display.

Figure 3A:
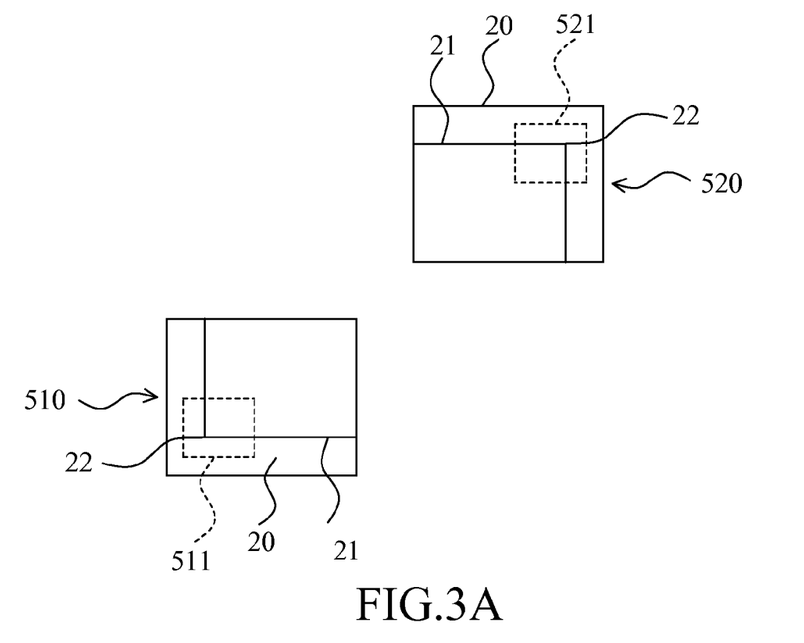
Figure 3B:
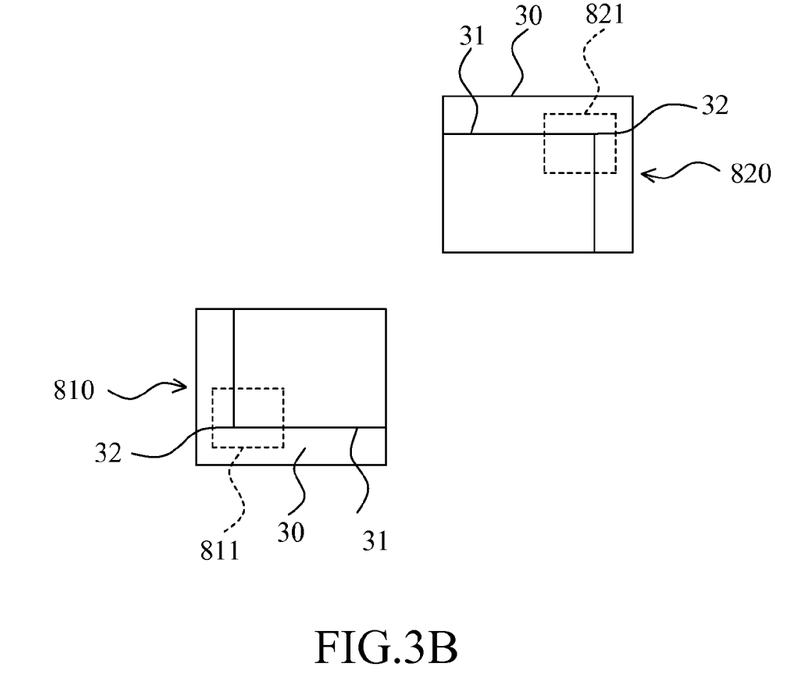

Referring to FIGS. 3, 3A and 3B, in the embodiment, first partially standard images 510 and 520 of the first substrate 20 can be captured by at least one first image capturing unit of charge-coupled device (CCD) or complementary metal oxide semiconductor (CMOS) type, for example, two sets of CCD type first image capturing units 51 and 52 are disposed diagonally (or at two ends of a same side) below two inner edge corners 22 of the first substrate 20, respectively, to capture the first partially standard images 510 and 520 of the first substrate 20. Then, the first partially standard images 510 and 520 are sent to an image processing device (not illustrated in the drawings, e.g. a computer) at a near end or remote end, and first partially standard character regions 511 and 521 (e.g. regional images including the inner edge corners 22) can be pre-defined in the first partially standard images 510 and 520, respectively, by the image processing device, and the character data of shapes of the first partially standard character regions 511 and 521 are stored.

In the embodiment, two sets of second image capturing units 81 and 82 of CCD or CMOS type are disposed diagonally (or at two ends of the same side) above two sealant corners 32 of the second substrate 30, respectively, to capture second partially standard images 810 and 820 of the second substrate 30. Then, the second partially standard images 810 and 820 are sent to the same image processing device, and second partially standard character regions 811 and 821 (e.g. regional images including the sealant corners 32) can be pre-defined in the second partially standard images 810 and 820, respectively, by the image processing device, and the character data of shapes of the second partially standard character regions 811 and 821 are stored.

The step (S01) needs to be finished before starting the assembling, its purpose is to have the character data of shapes of the first partially standard character regions 511 and 521 as well as the second partially standard character regions 811 and 821 stored as referenced standards for comparing images when the assembling is started in the step (S02).

Referring to FIGS. 2, 4, 4A and 4B, details of the step (S02) of the alignment method for assembling substrates in different spaces without fiducial mark of the preferred embodiment of the present invention are: capturing at least two partially actual images of the two substrates in different waiting spaces, respectively. In the step, the first substrate 20 to be aligned is placed in the first waiting space 100 and below the tri-axial movement device 40 by sucking or clamping. At the same time, the second substrate 30 to be aligned is placed on the supporting platform 60 of the rotational platform 70 in the second waiting space 200. There is a distance between the first waiting space 100 and the second waiting space 200, and the alignment-and-installation space 300 is disposed between them.

Figure 4:
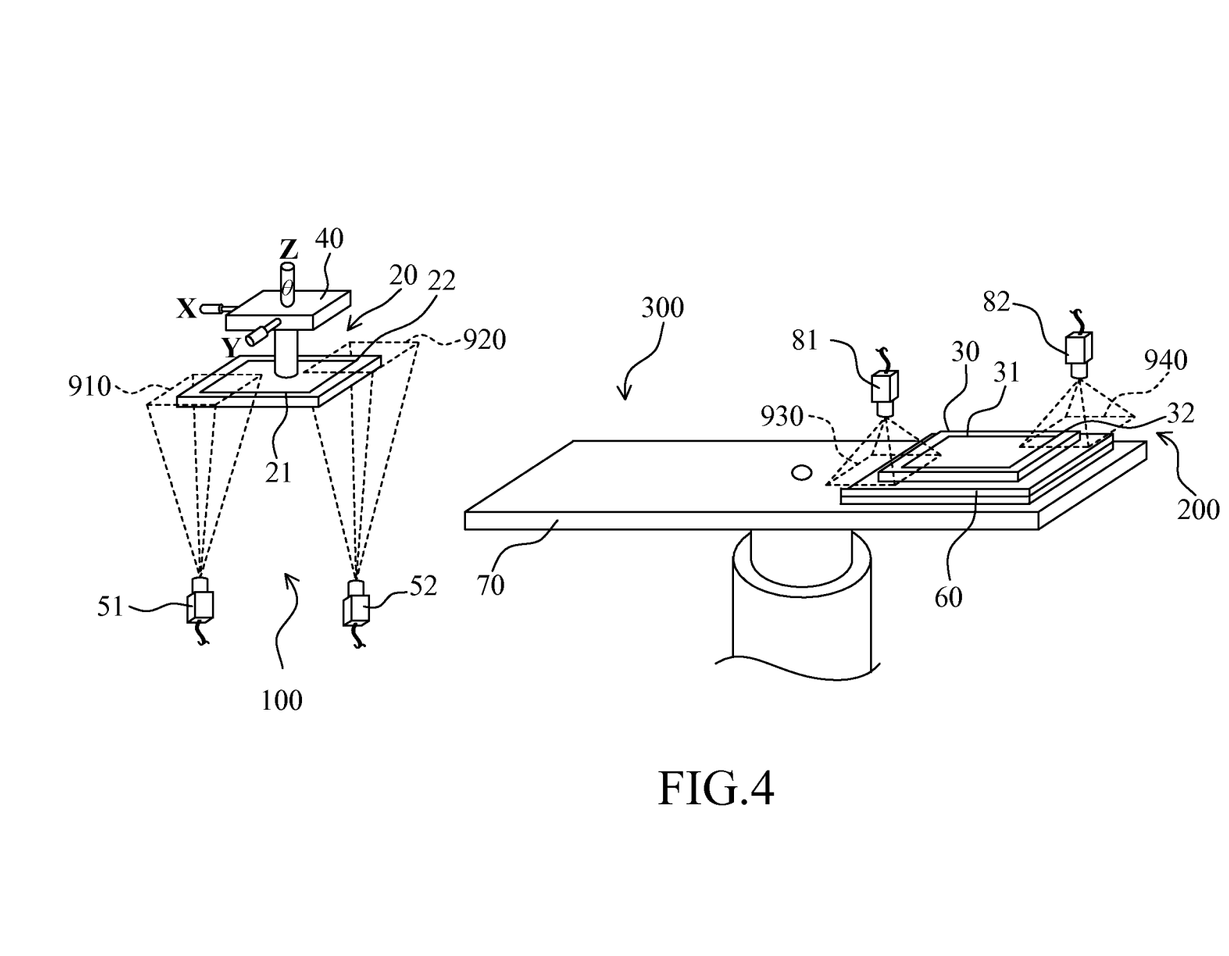
FIG. 4 is a perspective view of capturing at least two partially actual images of the two substrates in different waiting spaces in a step (S02) according to the preferred embodiment of the present invention.

Then, capturing first partially actual images 910 and 920 of the first substrate 20 by at least one set of the same first image capturing unit of CCD or CMOS type in this embodiment, for example, when the assembling is being processed, two sets of the CCD type first image capturing units 51 and 52 used in the step (S01) are used to captured at least two first partially actual images 910 and 920 of the to-be-aligned first substrate 20.

In this embodiment, capturing second partially actual images 930 and 940 of the second substrate 30 by at least one set of the same second image capturing unit of CCD or CMOS type, for example, when the assembling is being processed, two sets of the CCD type second image capturing units 81 and 82 used in the step (S01) are used to captured at least two second partially actual images 930 and 940 of the to-be-aligned second substrate 30.

Referring to FIGS. 2, 4, 4A and 4B, details of the step (S03) of the alignment method for assembling substrates in different spaces without fiducial mark of the preferred embodiment of the present invention are: comparing to obtain at least two partially actual character regions of the two substrates, respectively. In the step, the first partially actual images 910 and 920 are sent to the same image processing device (e.g. a computer), and each of the first partially actual images 910 and 920 is compared with the character data of shapes of the first partially standard character regions 511 and 521 by the image processing device, respectively, in order to obtain at least two first partially actual character regions 911 and 921 in the first partially actual images 910 and 920 matching with the first partially standard character regions 511 and 521, and the character data of shapes of the first partially actual character regions 911 and 921 are stored.

Figure 4A:
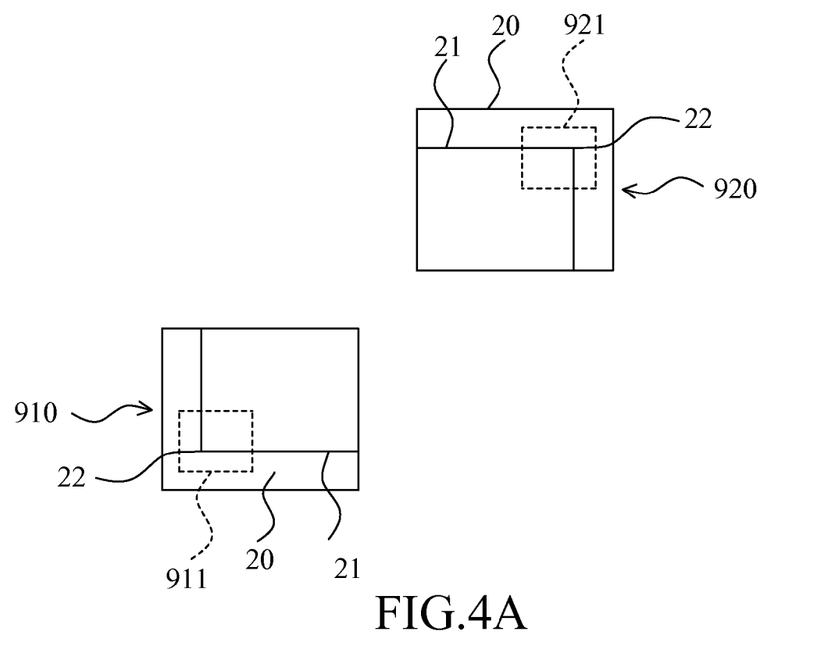
FIGS. 4A and 4B are partially enlarged views of comparing to obtain at least two partially actual character regions of the two substrates, respectively, in a step (S03) according to the preferred embodiment of the present invention.
Figure 4B:
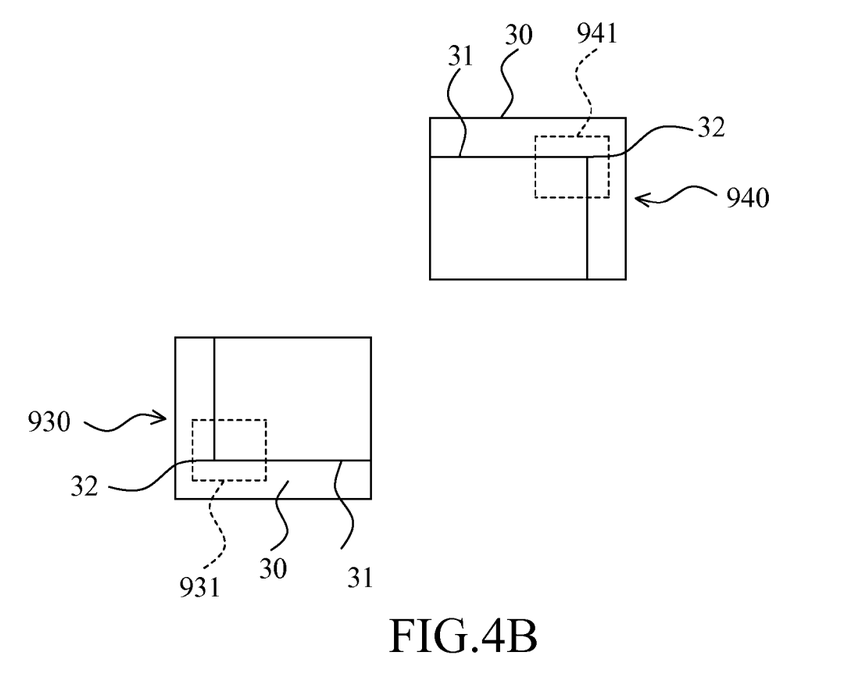

The second partially actual images 930 and 940 are sent to the same image processing device, and each of the second partially actual images 930 and 940 is compared with the character data of shapes of the second partially standard character regions 811 and 821 by the image processing device, respectively, in order to obtain at least two second partially actual character regions 931 and 941 in the second partially actual images 930 and 940 matching with the second partially standard character regions 811 and 821, and the character data of shapes of the second partially actual character regions 931 and 941 are stored.

Referring to FIGS. 2 and 4, details of the step (S04) of the alignment method for assembling substrates in different spaces without fiducial mark of the preferred embodiment of the present invention are: building an actual coordinate system of the two substrates, respectively. In the step of the preferred embodiment, computing with centroid (geometrical center) method by the same image processing device (e.g. a computer) to obtain the center coordinates of a geometrical central position of each of the first partially actual character regions 911 and 921 in order to build a first actual coordinate system of the first substrate 20. For example, computing with centroid method by a computer to obtain center coordinates (X1,Y1) of a first geometrical central position of the first partially actual character region 911 and center coordinates (X2,Y2) of a second geometrical central position of the first partially actual character regions 921, and so on. When defining the center coordinates of each of the first partially actual character regions 911 and 921, known coordinate values of predetermined regions of the at least two first image capturing units 51 and 52 can be used as referenced standards to define center coordinate values of each of the first partially actual character regions 911 and 921. Lastly, the first actual coordinate system of the first substrate 20 can be built by the image processing device using at least the two sets of center coordinates (X1,Y1) and (X2,Y2).

In the present invention, the center coordinates of a geometrical central position of each of the second partially actual character regions 931 and 941 can also be obtained by computing with centroid (geometrical center) method by the same image processing device in order to build a second actual coordinate system of the second substrate 30. For example, computing with centroid method by a computer to obtain center coordinates (X3,Y3) and (X4,Y4) of geometrical central positions of the two second partially actual character regions 931 and 941, and so on. Known coordinate values of predetermined regions of the at least two second image capturing units 81 and 82 can be used as referenced standards to define center coordinate values of each of the second partially actual character regions 931 and 941. Lastly, the second actual coordinate system of the second substrate 30 can be built by the image processing device.

Referring to FIGS. 2 and 4, details of the step (S05) of the alignment method for assembling substrates in different spaces without fiducial mark of the preferred embodiment of the present invention are: comparing the actual coordinate systems of the two substrates to obtain a set of offset values. In the step, by comparing the first actual coordinate system of the first substrate 20 and the second actual coordinate system of the second substrate 30 by the image processing device, a set of offset values $\Delta X$, $\Delta Y$, $\Delta \theta$ of the first substrate 20 on the X and Y axial directions and a rotational angle required for moving from the first waiting space 100 to the alignment-and-installation space 300 can be obtained. A predetermined movement value (e.g. $\Delta X'$) of the second substrate 30 on the X axial direction required for moving from the second waiting space 200 to the alignment-and-installation space 300 has been pre-deducted for the offset values $\Delta X$, $\Delta Y$, $\Delta \theta$ referred in the present invention; it means a difference of values between the first actual coordinate system of the first substrate 20 and the second actual coordinate system of the second substrate 30 on the X axial direction is $\Delta X + \Delta X'$, but only the offset value $\Delta X$ is required for the first substrate 20 to be moved from the first actual coordinate system to the alignment-and-installation space 300 along the X axial direction.

Figure 5:
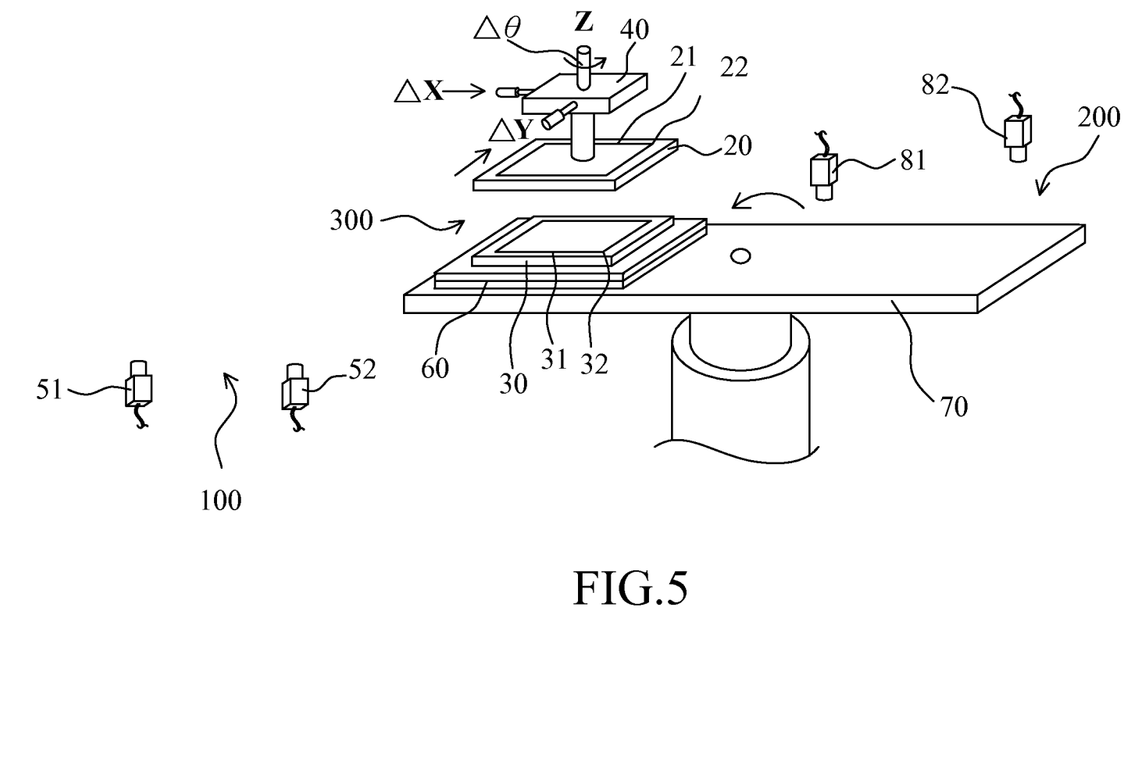
FIG. 5 is a perspective view of moving the two substrates from their waiting spaces to an alignment-and-installation space, respectively, based on a set of offset values and another predetermined movement value in a step (S06) according to the preferred embodiment of the present invention.

Referring to FIGS. 2 and 5, details of the step (S06) of the alignment method for assembling substrates in different spaces without fiducial mark of the preferred embodiment of the present invention are: moving the two substrates from the different waiting spaces to an alignment-and-installation space based on the set of offset values and a predetermined movement value, respectively. In the step, the tri-axial movement device 40 is employed in the embodiment to move the first substrate 20 along the X, Y and θ axes, and the first substrate 20 is moved to a correct waiting position in the alignment-and-installation space 300 based on the set of offset values ΔX, ΔY, Δθ. The rotational platform 70 can be used in the present invention for rotating and moving the supporting platform 60 and the second substrate 30 horizontally along the X and Y planes to the alignment-and-installation space 300; the second substrate 30 is moved to the other correct waiting position (e.g. right below or right above the first substrate 20 along the Z axis thereof) in the alignment-and-installation space 300 to be assembled based on a predetermined movement value ΔX'.

Referring to FIGS. 2 and 5, if necessary, the step (S07) can be further included after the step (S06) in the present invention in order to ensure the correctness of processing of the step (S06): ensuring if the two substrates are disposed at the correct corresponding waiting positions in the alignment-and-installation space, respectively. In this step, the partially actual images of the first and the second substrates 20 and 30 are captured by another two image capturing units (not illustrated in the drawings), respectively in the alignment-and-installation space 300, and the coordinate values of the first and the second substrates 20 and 30 are computed with centroid method in order to ensure if the first and the second substrates 20 and 30 are at the correct corresponding waiting positions in the alignment-and-installation space 300, respectively, for example, if the second substrate 30 is right below or right above the first substrate 20 along the Z axis thereof. If yes, then proceeding to the step (S08); if not, then processing the step (S07) again after the positions of the first and the second substrates 20 and 30 are fine tuned by the tri-axial movement device 40 and the rotational platform 70 until the result is positive. It should be noted that, this step can be processed two times or more in order to ensure the correctness, but if an efficiency of inspection and testing is demanded or for avoiding disposing any image capturing unit in the alignment-and-installation space 300, then this ensuring step can be omitted and proceeding to the step (S08) directly.

Figure 6:
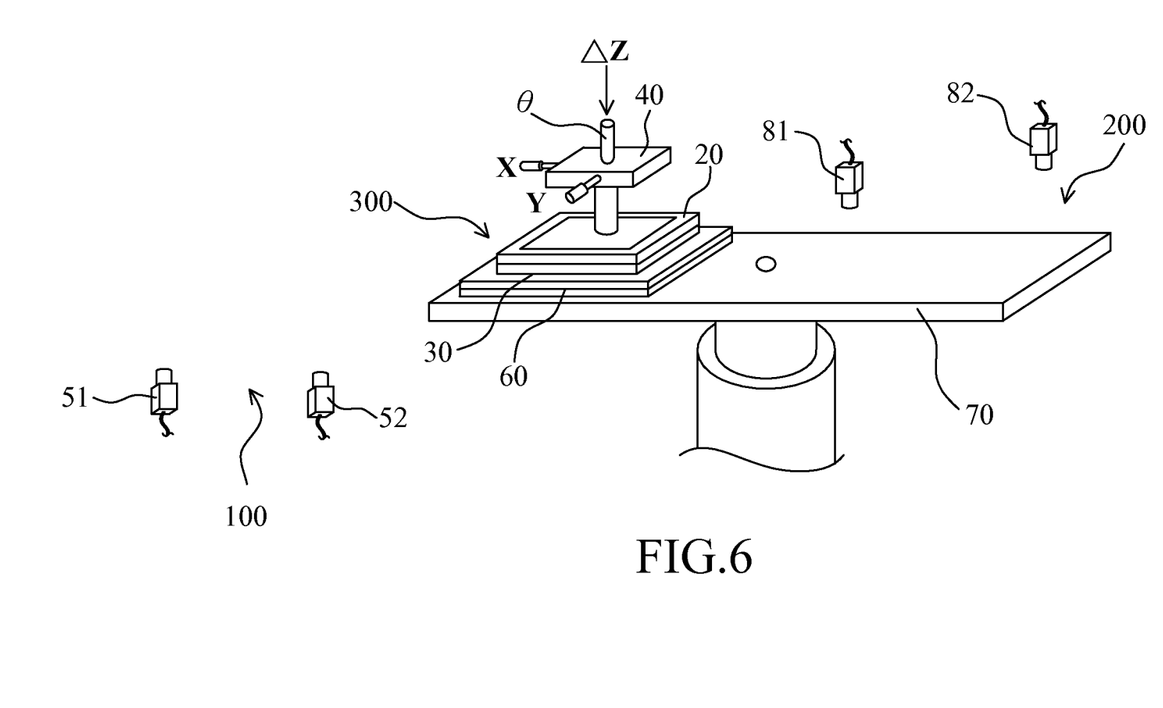
FIG. 6 is a perspective view of stacking the two substrates to finish the alignment and installation in the alignment-and-installation space in a step (S08) according to the preferred embodiment of the present invention.

Referring to FIGS. 2 and 6, details of the step (S08) of the alignment method for assembling substrates in different spaces without fiducial mark of the preferred embodiment of the present invention are: stacking the two substrates with each other to finish the alignment and installation in the alignment-and-installation space. In this step, the tri-axial movement device 40 is employed in this embodiment to move the first substrate 20 by a predetermined movement value ΔZ along the Z axis (e.g. moving vertically by a predetermined distance downward) until it is aligned and stacked with the second substrate 30 on the supporting platform 60 in the alignment-and-installation space 300 to finish with the assembling. Thereby, the first substrate 20 and the second substrate 30 are finished with the alignment and installation.

Furthermore, as shown in FIGS. 3 to 6, in order to align and assemble substrates in different spaces without fiducial mark, an alignment system for assembling substrates in different spaces without fiducial mark is further provided by the present invention, and the alignment system comprises:

at least one of the first image capturing units 51 and 52 for capturing the at least two first partially standard images 510 and 520 of the first substrate 20 before assembling; and/or for capturing the at least two first partially actual images 910 and 920 of the other to-be-aligned first substrate 20 placed in the first waiting space 100 when the assembling is being processed;

at least one of the second image capturing units 81 and 82 for capturing the at least two second partially standard images 810 and 820 of the second substrate 30 before assembling; and/or for capturing the at least two second partially actual images 930 and 940 of the other to-be-aligned second substrate 30 placed in the second waiting space 200 when the assembling is being processed;

an image processing device (not illustrated in the drawings, e.g. a computer), selectively for:

(1) pre-defining the first partially standard character regions 511 and 521 and the second partially standard character regions 811 and 821 in the first partially standard images 510 and 520 and the second partially standard images 810 and 820 of the two substrates 20 and 30, respectively, and storing their character data of shapes;

(2) comparing the first partially actual images 910 and 920 and the second partially actual images 930 and 940 of the two substrates 20 and 30 with the character data of shapes of the corresponding first partially standard character regions 511 and 521 and the second partially standard character regions 811 and 821, in order to obtain the at least two first partially actual character regions 911 and 921 and the second partially actual character regions 931 and 941 in each of the first partially actual images 910 and 920 and the second partially actual images 930 and 940 matching with the corresponding first partially standard character regions 511 and 521 and the second partially standard character regions 811 and 821;

(3) building the actual coordinate system of each of the substrates 20 and 30 by using the center coordinates of the first partially actual character regions 911 and 921 and the second partially actual character regions 931 and 941, respectively; or (4) comparing the actual coordinate systems of the substrates 20 and 30 to obtain the set of offset values ΔX, ΔY, Δθ of the first substrate 20 on the X and Y axial directions and a rotational angle required for moving from the first waiting space 100 to the alignment-and-installation space 300;

the tri-axial movement device 40 for moving the first substrate 20 from the first waiting space 100 to a correct waiting position in the alignment-and-installation space 300 based on the set of offset values ΔX, ΔY, Δθ; and the carrying device having at least one set of the supporting platform 60 disposed thereon, wherein the carrying device is used for moving the second substrate 30 from the second waiting space 200 to the other correct waiting position in the alignment-and-installation space 300 based on a predetermined movement value (e.g. ΔX').

For this embodiment, the carrying apparatus is the rotational platform 70 for rotating and moving the supporting platform 60 and the second substrate 30 horizontally along the X and Y planes to the alignment-and-installation space 300; in other applications, the carrying apparatus can be a sliding platform for moving the supporting platform 60 and the second substrate 30 linearly along the X and Y planes to the alignment-and-installation space 300.

As a conclusion from the abovementioned and comparing the present invention with the drawbacks of using alignment holes and cross, circular or rectangular alignment fiducial marks in the existing alignment and movement control method of dual plates as the alignment fiducial marks between the dual plates, as shown in FIGS. 2 to 6 of the present invention, when two substrates are disposed in two waiting spaces of different space systems, existing characters of surface shapes of partially specific regions of the two substrates in the different waiting spaces are captured by two sets of image capturing units, respectively, for being directly used as referenced fiducial marks to replace the existing alignment holes and fiducial marks, and to be provided for subsequent procedures of coordinates calculating, positions calibrating and alignment for assembling, so that the movement compensation values required for the assembling of the to-be-installed substrates can be calculated without any fiducial mark specifically designed for alignment, and the limited space for alignment and assembling will not be occupied, thus the costs of alignment for assembling can be reduced, the alignment precision and an flexibility of the set up of alignment equipment can be enhanced.

Furthermore, according to the present invention, existing characters of surface shapes of partially specific regions of two substrates are directly used as referenced fiducial marks, specific regions on the two substrates are not required to be reserved, respectively, for disposing alignment holes and fiducial marks, so that the spaces on surfaces of the two substrates will not be occupied and the dimensions of the two substrates will not be affected, also the appearances of the two substrates will not be affected and the designing for the two substrates can be simplified.

Moreover, according to the present invention, when alignment and assembling are processed for substrates of different specifications by machines, existing characters of a surface shape of a particular partial region of the two substrates can be set and changed as referenced fiducial marks by an image processing device based on the different specifications of the substrate, so that a flexibility of operational settings for the alignment and assembling of the substrates can be enhanced.

The present invention has been described with preferred embodiments thereof and it is understood that many changes and modifications to the described embodiments can be carried out without departing from the scope and the spirit of the invention that is intended to be limited only by the appended claims.

What is claimed is:

1. An alignment method for assembling substrates in different spaces without fiducial mark, comprising steps of:
   a step (S01) of pre-capturing at least two standard regional images of a first substrate and a second substrate, respectively, and pre-defining a standard character region in each of the standard regional images of the first and second substrates and storing character data of shapes of the standard character regions before assembling;
   a step (S02) of disposing another to-be-aligned first substrate and another to-be-aligned second substrate in two different waiting spaces, respectively, and capturing at least two actual regional images of the first and second substrates when assembling;
   a step (S03) of comparing the actual regional images of the first and second substrates with the character data of shapes of the corresponding standard character regions to obtain at least two actual character regions in each of the actual regional images matching with the corresponding standard character regions;
   a step (S04) of building actual coordinate systems of the first and second substrates by using center coordinates of the actual character regions;
   a step (S05) of comparing the actual coordinate systems of the first and second substrates to obtain a set of offset values $\Delta X$, $\Delta Y$, $\Delta \theta$ of the first substrate on the X and Y axial directions and the rotational angle required to be moved from its waiting space to an alignment-and-installation space; and
   a step (S06) of moving the first substrate to a correct waiting position in the alignment-and-installation space based on the set of offset values, and moving the second substrate to the other correct waiting position in the alignment-and-installation space based on a predetermined movement value;
   a step (S07) of capturing the actual regional images of the first and second substrates in the alignment-and-installation space and calculating the coordinate values of the actual regional images, in order to ensure if the first and second substrates are disposed at the correct waiting positions in the alignment-and-installation space, respectively, if yes, then proceeding to a step (S08); if not, then processing the step (S07) again after the positions of the first and second substrates are fine tuned; and
   a step (S08) of moving the first substrate along the Z axis in the alignment-and-installation space until the first substrate is aligned with the second substrate in the alignment-and-installation space to finish alignment and assembling.

2. The alignment method for assembling substrates in different spaces without fiducial mark as claimed in claim 1, wherein the center coordinates of a central position of each of the actual character regions of the first and second substrates in the step (S04) are obtained by computing with a centroid method in order to build the actual coordinate systems of the first and second substrates, respectively.

3. The alignment method for assembling substrates in different spaces without fiducial mark as claimed in claim 1, wherein a tri-axial movement device is used to move the first substrate along the X, Y and $\theta$ axes in the step (S06).

4. The alignment method for assembling substrates in different spaces without fiducial mark as claimed in claim 3, wherein the tri-axial movement device is used to further move the first substrate along the Z axis vertically.

5. The alignment method for assembling substrates in different spaces without fiducial mark as claimed in claim 1, wherein at least one supporting platform and a rotational platform are further included in the step (S06), the supporting platform is used to support the second substrate, and the rotational platform is used to rotate and move the second substrate horizontally along the X and Y planes to the alignment-and-installation space.

6. The alignment method for assembling substrates in different spaces without fiducial mark as claimed in claim 1, wherein the first and the second substrates are selected from two single layered circuit substrates of a multi-layered printed circuit board, two glass substrates of a liquid crystal panel module, an outer frame of a display and a liquid crystal panel module, a glass photomask and a wafer, or a chemical test paper and a protective film.

7. An alignment system for assembling substrates in different spaces without fiducial mark, comprising:
   at least one first image capturing unit to capture at least two standard regional images of a first substrate before assembling, and/or to capture at least two actual regional images of another to-be-aligned first substrate placed in a first waiting space when the assembling is being processed;
   at least one second image capturing unit to capture at least two standard regional images of a second substrate before assembling; and/or to capture at least two actual regional images of another to-be-aligned second substrate placed in a second waiting space when the assembling is being processed;

an image processing device, selectively to:
(1) pre-define a standard character region in the standard regional images of the first and second substrates, respectively, and store the character data of shapes of the standard character regions;
(2) compare the actual regional images of the first and second substrates with the character data of shapes of the corresponding standard character regions, in order to obtain at least two actual character regions in each of the actual regional images matching with the corresponding standard character regions;
(3) build an actual coordinate system of each of the first and second substrates by using the center coordinates of the actual character regions, respectively; or
(4) compare the actual coordinate systems of the first and second substrates to obtain a set of offset values of the first substrate on the X and Y axial directions and a rotational angle required to be moved from the first waiting space to an alignment-and-installation space;

a tri-axial movement device to move the first substrate from the first waiting space to a correct waiting position in the alignment-and-installation space based on the set of offset values;

a carrying device having at least one set of supporting platform disposed thereon, wherein the carrying device is used to move the second substrate from the second waiting space to the other correct waiting position in the alignment-and-installation space based on a predetermined movement value; and two third image capturing units to capture the actual regional images of the first and second substrates in the alignment-and-installation space for calculating the coordinate values of the actual regional images, in order to ensure if the first and second substrates are disposed at the correct waiting positions in the alignment-and-installation space, respectively, wherein if yes, the tri-axial movement device then moves the first substrate along the Z axis vertically in the alignment-and-installation space until the first substrate is aligned with the second substrate in the alignment-and-installation space to finish alignment and assembling; if not, the third image capturing units capture the actual regional images of the first and second substrates in the alignment-and-installation space again after the positions of the first and second substrates are fine tuned.

* * * * *